United States Patent [19]
Chang

[11] Patent Number: 6,028,780
[45] Date of Patent: *Feb. 22, 2000

[54] TWO-PHASE CLOCK CHARGE PUMP WITH POWER REGULATION

[75] Inventor: Chung K. Chang, Santa Clara, Calif.

[73] Assignee: EON Silicon Devices, Inc., Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 09/041,876

[22] Filed: Mar. 12, 1998

[51] Int. Cl.[7] ...................................... H02M 3/18
[52] U.S. Cl. ................. 363/60; 365/185.33; 365/218
[58] Field of Search ................. 363/60, 59; 307/110; 365/185.25, 185.29, 285.33, 189.09, 218

[56] References Cited

U.S. PATENT DOCUMENTS

| | | | |
|---|---|---|---|
| 5,263,000 | 11/1993 | Van Burskirk et al. | 365/226 |
| 5,282,170 | 1/1994 | Van Burskirk et al. | 365/226 |
| 5,291,446 | 3/1994 | Van Burskirk et al. | 365/189.09 |
| 5,301,097 | 4/1994 | McDaniel | 363/60 |
| 5,406,517 | 4/1995 | Chang et al. | 365/189.09 |
| 5,432,469 | 7/1995 | Tedrow et al. | 327/306 |
| 5,612,921 | 3/1997 | Chang et al. | 365/226 |
| 5,719,807 | 2/1998 | Sali et al. | 365/185.25 |

*Primary Examiner*—Shawn Riley
*Attorney, Agent, or Firm*—Fish & Richardson P.C.

[57] ABSTRACT

A method and apparatus for providing a charge pump that is particularly useful for generating high voltages and high currents for erasing and programming flash electrically-erasable programmable read only memory arrays (Flash EEPROMs). The invention includes an efficient method and circuit for generating a pumped voltage with no voltage drop from one stage to the next by using a simple two-phase clocking scheme and an auxiliary pump to gate a larger primary pump. One feature allows adjustment of the level of voltage pumping to accommodate higher voltage power supplies.

12 Claims, 2 Drawing Sheets

TWO-PHASE CLOCK CHARGE PUMP WITH POWER REGULATION

RELATED APPLICATION

This application is related to co-pending U.S. patent application Ser. No. 09/041,873, entitled "A Two-Phase Charge Pump with Opposite Type MOS Transistor Gated Channels" and assigned to the assignee of the present invention, the contents of which are hereby incorporated by reference.

TECHNICAL FIELD

This invention relates to computer systems, and more particularly to a method and apparatus for providing a charge pump that is particularly useful for generating high voltages and high currents for erasing and programming flash electrically-erasable programmable read only memory arrays (Flash EEPROMs).

BACKGROUND

The use of computers has grown so extensive that the power used by these computers has become significant. In order to reduce the cost of operation as well as the consequent use of energy resources, a substantial move is underway to reduce such power usage. A major trend in the manufacture of personal computers is toward a reduction in the voltage level required to operate the integrated circuits which are used in the various components of those computers. A simultaneous trend is the desire to provide portable computers which are able to provide most of the abilities of desktop computers but are assembled in very small and light packages. This has led to attempts to reduce the power used by portable computers so that their battery life will be extended.

In order to reduce power consumption and extend battery life, much of the integrated circuitry used in personal computers is being designed to run at low voltage levels. This reduces the power usage and allows more components to be placed closer to one another. The circuitry and components used in portable computers typically are being designed to operate at voltages levels less than about 5 V, with 3.3 V and lower becoming more common. Lower voltages helps a great deal to reduce the power needs of personal computers.

However, the desire to offer more features in portable computers has led to an increase in the number of circuits used, thus requiring more power. Further, a number of such features require higher voltages to function properly. For example, one real convenience is the ability to change the basic input/output system (BIOS) of a computer as improvements in a computer or its peripherals occur. Historically, such changes have been accomplished by removing an electrically programmable read only memory (EPROM) device or similar circuit that provides a non-volatile read only memory for storing the BIOS code and replacing that circuit with a new circuit at additional cost. Further, this procedure is beyond the abilities of many computer users. Recently, "flash" electrically-erasable programmable read only memory (Flash EEPROM memory) has been used to store BIOS code. This type of non-volatile memory device may be reprogrammed by running a small update program without removing the circuitry from the computer. However, reprogramming Flash EEPROM memory requires approximately 12 V to accomplish effectively. The lower voltage batteries provided in personal computers generally are not capable of programing and erasing Flash EEPROM memory.

Further, a relatively new form of long term random access storage has been devised using Flash EEPROM devices in large arrays to mimic hard disk drives. Flash EEPROM arrays provide a smaller and lighter functional equivalent of a hard disk drive which operates more rapidly and is less sensitive to physical damage. Such memory arrays are especially useful in portable computers where space is at a premium and weight is extremely important. However, Flash EEPROM memory arrays also require much higher voltages for writing and erasing data than can be provided directly by the batteries of most portable computers.

In situations in which batteries do not provide sufficient voltages, it has been typical to provide "charge pumps" to generate a higher voltage from the lower voltages available. In particular, for some single supply voltage Flash EEPROM memory devices, it is necessary to generate voltages greater than the device supply voltage (VCC) and/or voltages more negative than ground using such charge pumps. However, although such voltages charge pumps are able to increase the voltage to an appropriate level, most charge pumps do not provide sufficient current to generate the power for effectively erasing and programming Flash EEPROM memory without the use of very large capacitors, which utilize an inordinate mount of die space.

More particularly, the voltage required for the drain side of a Flash EEPROM memory cell during programming is typically about 5.0 V to 5.5 V, which is higher than the typical minimum power supply (VCC) value of 4.5 V. The current required to program such a memory cell is relatively quite large, typically about 4mA for an 8-bit memory device. Since power consumption of devices is increasingly a concern, it is important that this relatively large current be produced efficiently.

It is also important that charge pumped voltages be produced efficiently. An efficient design can lead to usage of smaller capacitors with obvious advantages. For CMOS integrated circuits, prior charge pumps typically were constructed of switched MOSFET transistors and MOSFET capacitors using 4-phase clocking techniques to eliminate a voltage drop from one stage of the charge pump to the next. An example of one such prior art charge pump is shown in U.S. Pat. No. 5,432,469 to Tedrow, et al.

SUMMARY

This invention relates to computer systems, and more particularly to a method and apparatus for providing a charge pump that is particularly useful for generating high voltages and high currents for erasing and programming flash electrically-erasable programmable read only memory arrays (Flash EEPROMs). In particular, the invention includes an efficient method and circuit for generating a pumped voltage with no voltage drop from one stage to the next by using a simple two-phase clocking scheme and an auxiliary pump to gate a larger primary pump.

In one aspect, the invention includes a charge pump circuit including an input for receiving an input voltage to be pumped; an auxiliary charge pump, coupled to the input, and having a first and a second auxiliary channel, for alternately pumping the input voltage to a voltage Vcharge in excess of the input voltage in each of the first and second auxiliary channels; a primary charge pump, coupled to the input and to the first and second auxiliary channels of the auxiliary charge pump, and having a first and a second primary channel, for alternately pumping the input voltage to a voltage in excess of the input voltage in each of the first and second primary channels under the control of the first and second auxiliary channels; and an output, coupled to each of the first and second primary channels, to allow transmission of a voltage pumped charge through the first and second primary channels.

Advantages of the invention compared to a 4-phase charge pump: use of a simpler clock generator; easier layout of capacitors since only two clocks are used rather than four; no requirement for charging and discharging of auxiliary capacitors, thus resulting in higher power efficiency; and no net diode voltage drop from one stage to the next, as is the case with simpler charge pumps. The preferred embodiment also includes a feature that allows adjustment of the level of voltage pumping to accommodate higher voltage power supplies.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference numbers and designations in the various drawings indicate like elements.

DETAILED DESCRIPTION

Figure 1:
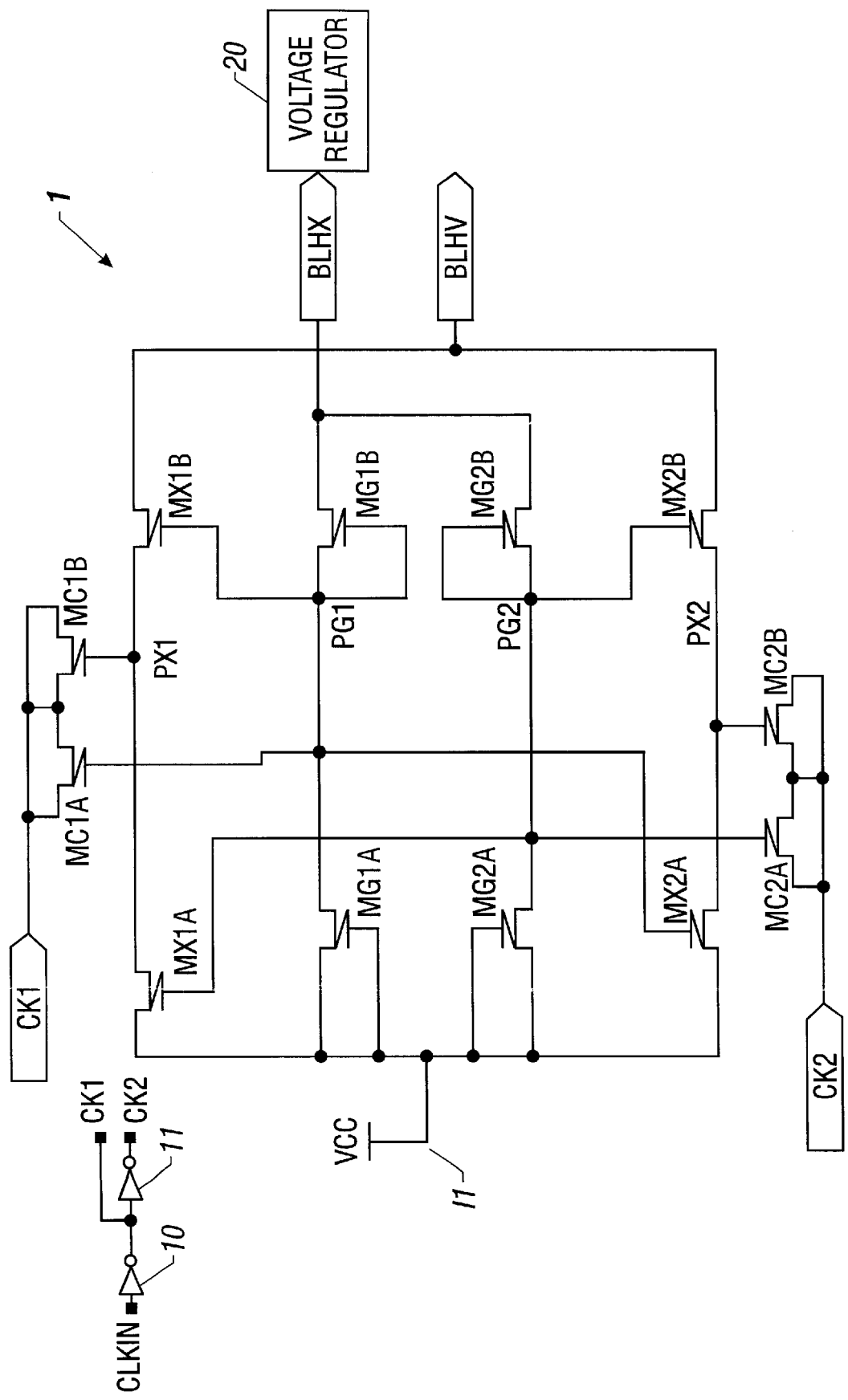
FIG. 1 is a schematic diagram of a preferred embodiment of the invention, showing one charge pumping stage.
Figure 2:
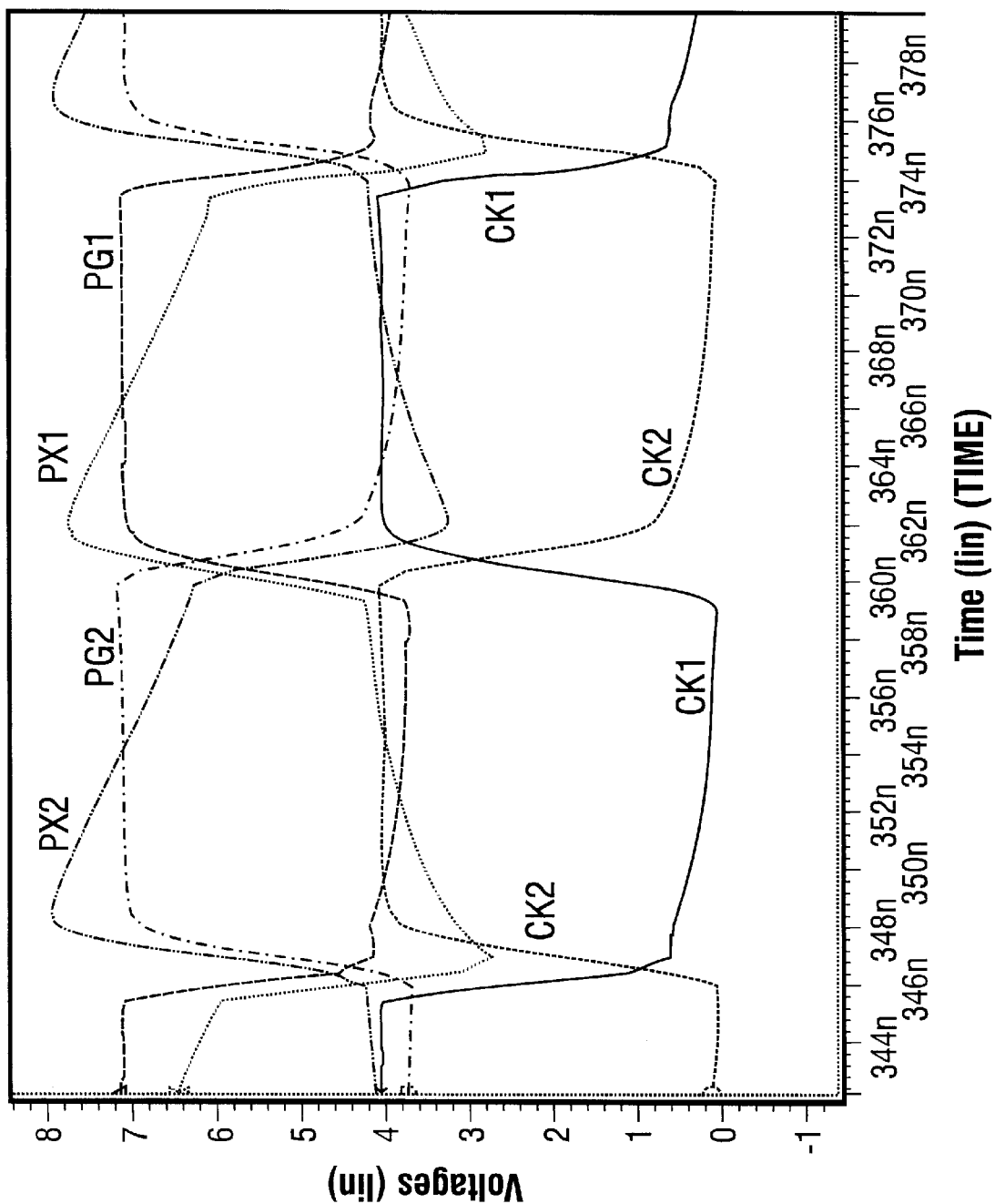
FIG. 2 is a timing diagram for the circuit shown in FIG. 1.

FIG. 1 is a schematic diagram of a preferred embodiment of the invention, showing one charge pumping stage 1. The invention is preferably implemented as an integrated circuit. FIG. 2 is a timing diagram for the circuit shown in FIG. 1.

Referring to FIG. 1, as shown at the top of the schematic, opposite phase clocking signals CK1 and CK2 are generated by a pair of serially-coupled inverters 10, 11 from an input clock signal CLKIN. However, any desired means for generating opposite phase clocking signals may be used. The two-phase clocking signals CK1 and CK2 are coupled to the charge pump 1 as shown.

The charge pump 1 includes an auxiliary section and a primary section. The auxiliary section has two conventional diode-capacitor charge pumps, preferably using n-channel diode-connected transistors as the diode. In particular, in the preferred embodiment, the auxiliary section includes (1) an NMOS charging capacitor MC1A clocked by signal CK1, plus diodes MG1A and MG1B forming a first auxiliary pumping channel and defining a first auxiliary node PG1, and (2) an NMOS charging capacitor MC2A clocked by signal CK2, plus diodes MG2A and MG2B forming a second auxiliary pumping channel and defining a second auxiliary node PG2. An input I1 receives a voltage VCC to be pumped. The auxiliary section of the charge pump generates two switching voltages at nodes PG1 and PG2 that are just somewhat higher than the input voltage VCC. These switching voltages control pass gates in the primary section, which is a larger charge pump which provides the actual charge pumped voltage and a relatively large current.

The primary section of the charge pump includes (1) an NMOS charging capacitor MC1B clocked by signal CK1, plus transistors MX1A and MX1B forming a first primary pumping channel and defining a first primary node PX1, and (2) an NMOS charging capacitor MC2B clocked by signal CK2, plus transistors MX2A and MX2B forming a second primary pumping channel and defining a second primary node PX2. Transistors MX1B and MX2A are pass gates controlled by the voltage at node PG1, and transistors MX1A and MX2B are pass gates controlled by the voltage at node PG2.

The primary transistors MX1A, MX1B, MX2A, and MX2B are capable of switching larger currents than the auxiliary transistors MG1A, MG1B, MG2A, and MG2B. A typical ratio of sizes for the primary transistors to auxiliary transistors would be in the range of about 3:1. Each of the transistors MG1A, MG1B, MG2A, MG2B, MX1A, MX1B, MX2A, and MX2B have conventional source, drain, and control gate contacts, as is known in the art. The charging capacitor pairs for each clocking signal (i.e., MC1A and MC1B for CK1, and MC2A and MC2B for CK2) would typically have a capacitance ratio in the range of about 1:5 to 1:10.

While in the preferred embodiment, the capacitors are NMOS, they may be implemented using any suitable technology. Note also that the voltages to which PG1 and PX1 are charged may be different, depending on the electrical characteristics of the corresponding capacitors MC1A and MC1B; similarly, the voltages to which PG2 and PX2 are charged may be different, depending on the electrical characteristics of the corresponding capacitors MC2A and MC2B.

The input voltage VCC is coupled to each of the first and second auxiliary pumping channels, and to each of the first and second primary pumping channels, so as to allow application of the voltage to be pumped to auxiliary nodes PG1 and PG2, and to primary nodes PX1 and PX2, thereby charging such nodes. The pumped voltage is available at output BLHV, which is coupled to each of the first primary pumping channel and the second primary pumping channel to allow transmission of the voltage pumped charge from nodes PX1 and PX2, respectively.

The auxiliary nodes PG1 and PG2 from the auxiliary pump section switch from a base voltage Vbase (which is approximately VCC minus the threshold voltage Vth for the switching transistors) to a voltage Vcharge which is higher than VCC, as determined by the corresponding charging capacitors, MC1A and MC2A. For example, assuming a 4.35 V VCC supply, Vcharge would be about 3 V above VCC. The voltages at nodes PG1 and PG2, when greater than VCC, are used to gate the larger transistors MX1A, MX1B, MX2A, and MX2B of the primary pumping channels, which allows full charge transfer from VCC to nodes PX1 and PX2, and from there to output BLHV, provided that the output voltage, BLHV, is less than approximately 2×VCC−2×Vth.

In operation, when signal CK1 is high and signal CK2 is low, node PX2 is coupled low by capacitor MC2B while node PG1 is coupled by capacitor MC1A to Vcharge. The voltage on node PG1 turns transistor MX2A fully on, so that the input voltage VCC is then fully transferred onto node PX2 as a charge. Note that since signal CK2 is low, node PG2 discharges to about Vbase so that transistor MX2B is turned off during this half cycle.

Half a cycle later, when signal CK2 is switched to high and signal CK1 is switched to low, node PG2 is coupled by capacitor MC2A to Vcharge. The voltage on node PG2 turns transistor MX2B on, so that full charge transfer can take place from node PX2 to the output BLHV. Since signal CK1 had switched low, node PG1 discharges to about Vbase, which turns transistor MX2A off.

The operation of the charge pump for node PX1 is symmetrical but opposite in phase to the operation for node PX2.

Thus, nodes PG1 and PG2 of the auxiliary pump, under control of the charging capacitors MC1A and MC2A and the clocking signals CK1 and CK2, in turn control the switching of the pass transistors MX1A, MX1B, MX2A, and MX2B of the primary pump. Use of a simple two-phase clocking scheme to transfer charge from one stage to the next permits the inventive circuit to provide a pumped voltage with no voltage drop from one stage to the next, provided that the output voltage required is less than approximately 2×VCC −2×Vth.

The timing diagram shown in FIG. 2 shows the cycles for the CK1 and CK2 clocking signals, and corresponding voltages at nodes PX1, PX2, PG1, and PG2.

In the embodiment illustrated in FIG. 1, the output of the auxiliary section of the charge pump goes to node BLHX, which can be pulled low by a conventional voltage regulator circuit 20 when the current output of the charge pump is too high. Such action would reduce the voltages at nodes PG1 and PG2, which in turn would reduce the effective conductance of the pass transfer transistors MX1A, MX1B, MX2A, and MX2B, reducing the current output of the charge pump and reducing the power consumed by the charge pump circuit. This feature is useful for the case when operating at higher VCC ranges, where the charge pump may generate too much current and consume excessive amounts of power.

Advantages of the invention compared to a 4-phase charge pump: use of a simpler clock generator; easier layout of capacitors since only two clocks are used rather than four; no requirement for charging and discharging of auxiliary capacitors, thus resulting in higher power efficiency; no net diode voltage drop from one stage to the next, as is the case with simpler charge pumps; and ability to adjust the level of voltage pumping to accommodate higher voltage power supplies.

A number of embodiments of the present invention have been described. Nevertheless, it will be understood that various modifications may be made without departing from the spirit and scope of the invention. For example, more stages can be concatenated to generate higher voltages, and p-channel transistors can be used to generate negative voltages. Accordingly, other embodiments are within the scope of the following claims.

What is claimed is:

1. A charge pump circuit including:
   (a) an input for receiving an input voltage to be pumped;
   (b) a first auxiliary charging capacitor for receiving a first phase clocking signal;
   (c) a second auxiliary charging capacitor for receiving a second phase clocking signal, the second phase clocking signal being of opposite phase to the first phase clocking signal;
   (d) an auxiliary charge pump, coupled to the input and the first and second auxiliary charging capacitors, and having a first and a second auxiliary channel, for alternately pumping the input voltage to a voltage Vcharge in excess of the input voltage in each of the first and second auxiliary channels in response to the first and second phase clocking signals;
   (e) a first primary charging capacitor for receiving the first phase clocking signal;
   (f) a second primary charging capacitor for receiving the second phase clocking signal;
   (g) a primary charge pump, coupled to the input and to the first and second auxiliary channels of the auxiliary charge pump and to the first and second primary charging capacitors, and having a first and a second primary channel, for alternately pumping the input voltage to a voltage in excess of the input voltage in each of the first and second primary channels under the control of the first and second auxiliary channels and in response to the first and second phase clocking signals;
   (h) an output, coupled to each of the first and second primary channels, to allow transmission of a voltage pumped charge through the first and second primary channels.

2. The charge pump circuit of claim 1, wherein the circuit is implemented as an integrated circuit.

3. The charge pump circuit of claim 1, further including a voltage regulator coupled to the first and second auxiliary channels for regulating Vcharge in the first and second auxiliary channels to control current flow at the output.

4. The charge pump circuit of claim 1, wherein the full input voltage is passed within the first and second primary channels.

5. A charge pump circuit including:
   (a) an input for receiving an input voltage to be pumped;
   (b) a first auxiliary charging capacitor for receiving a first phase clocking signal;
   (c) a second auxiliary charging capacitor for receiving a second phase clocking signal, the second phase clocking signal being of opposite phase to the first phase clocking signal;
   (d) an auxiliary charge pump, coupled to the input and the first and second auxiliary charging capacitors, and having a first and a second auxiliary channel, for alternately pumping the input voltage to a voltage Vcharge in excess of the input voltage in each of the first and second auxiliary channels in response to the first and second phase clocking signals, wherein:
      (1) the first auxiliary channel includes a first diode pair defining a first control node between such diodes, the first control node being coupled to the first auxiliary charging capacitor; and
      (2) the second auxiliary channel includes a second diode pair defining a second control node between such diodes, the second control node being coupled to the second auxiliary charging capacitor;
   (e) a first primary charging capacitor for receiving the first phase clocking signal;
   (f) a second primary charging capacitor for receiving the second phase clocking signal;
   (g) a primary charge pump, coupled to the input and to the first and second auxiliary channels of the auxiliary charge pump and to the first and second primary charging capacitors, and having a first and a second primary channel, for alternately pumping the input voltage to a voltage in excess of the input voltage in each of the first and second primary channels under the control of the first and second auxiliary channels and in response to the first and second phase clocking signals, wherein:
      (1) the first primary channel includes:
         (A) a first transistor coupled to the input and controlled by the second control node;
         (B) a second transistor coupled to the first transistor and controlled by the first control node;
         (C) a first charge pumping node between the first and second transistors of the first primary channel, coupled to the first primary charging capacitor;
      (2) the second primary channel includes:
         (A) a first transistor coupled to the input and controlled by the first control node;

(B) a second transistor coupled to the first transistor and controlled by the second control node;

(C) a second charge pumping node between the first and second transistors of the second primary channel, coupled to the second primary charging capacitor;

(h) an output, coupled to each of the second transistors of each of the first and second primary channels, to allow transmission of a voltage pumped charge from the first and second charge pumping nodes.

6. The charge pump circuit of claim 5, wherein the circuit is implemented as an integrated circuit.

7. The charge pump circuit of claim 5, further including a voltage regulator coupled to the first and second auxiliary channels for regulating Vcharge in the first and second auxiliary channels to control current flow at the output.

8. The charge pump circuit of claim 5, wherein the full input voltage is passed within the first and second primary channels.

9. A method for operating a charge pump circuit including at least one stage, each stage including: an input for receiving an input voltage to be pumped; an auxiliary charge pump, coupled to the input, and having a first and a second auxiliary channel, for alternately pumping the input voltage to a voltage Vcharge in excess of the input voltage in each of the first and second auxiliary channels; a primary charge pump, coupled to the input and to the first and second auxiliary channels of the auxiliary charge pump, and having a first and a second primary channel, for alternately pumping the input voltage to a voltage in excess of the input voltage in each of the first and second primary channels under the control of the first and second auxiliary channels; an output, coupled to each of the first and second primary channels, to allow transmission of a voltage pumped charge through the first and second primary channels; the method including the steps of:

(a) providing a voltage to be pumped to the input;

(b) alternately pumping the input voltage to a voltage Vcharge in the first and second auxiliary channels;

(c) alternately applying the voltage Vcharge as a gating control signal to each of the first and second primary channels, thereby pumping the voltage in each such first and second primary channels to a level greater than the input voltage;

(d) alternately coupling the pumped voltage in the first and second primary channels to the output.

10. The method of charge pumping of claim 9, further including the step of implementing the charge pump circuit as an integrated circuit.

11. The method of charge pumping of claim 9, further including the step of regulating Vcharge in the first and second auxiliary channels to control current flow at the output.

12. The method of charge pumping of claim 9, further including the step of passing the full input voltage within the first and a second primary channels.

* * * * *